US009417644B2

(12) United States Patent
Kim et al.

(10) Patent No.: US 9,417,644 B2
(45) Date of Patent: Aug. 16, 2016

(54) APPARATUS FOR AND METHOD OF CONTROLLING POWER SUPPLY SYSTEM

(71) Applicant: SAMSUNG ELECTRO-MECHANICS CO., LTD., Suwon, Gyunggi-do (KR)

(72) Inventors: Chong Eun Kim, Gyunggi-do (KR); Jeong Nam Lee, Gyunggi-do (KR)

(73) Assignees: SAMSUNG ELECTRO-MECHANICS CO., LTD, Suwon-Si, Gyeonggi-Do (KR); SOLUM CO., LTD, Suwon-Si, Gyeonngi-Do (KR)

( * ) Notice: Subject to any disclaimer, the term of this patent is extended or adjusted under 35 U.S.C. 154(b) by 279 days.

(21) Appl. No.: 13/941,251

(22) Filed: Jul. 12, 2013

(65) Prior Publication Data

US 2014/0184178 A1 Jul. 3, 2014

(30) Foreign Application Priority Data

Dec. 27, 2012 (KR) ........................ 10-2012-0155301

(51) Int. Cl.
*H03M 1/12* (2006.01)
*G05F 1/46* (2006.01)

(52) U.S. Cl.
CPC ...................................... *G05F 1/468* (2013.01)

(58) Field of Classification Search
CPC .......... H03M 1/00; H03M 1/785; H03M 1/12
USPC ................................. 341/126, 154, 155, 162
See application file for complete search history.

(56) References Cited

U.S. PATENT DOCUMENTS

2005/0168363 A1* 8/2005 Harada ................. H03M 1/181 341/118
2011/0181454 A1* 7/2011 Cui ....................... H03M 1/002 341/156

FOREIGN PATENT DOCUMENTS

JP 2007-086525 A 4/2007
JP 2007-312084 A 11/2007

OTHER PUBLICATIONS

Patent Translate, Description JP 2007312084, pp. 1-28.*
Notice of Office Action Korean Patent Application No. 10-2012-0155301 dated Dec. 23, 2013 with English translation.

* cited by examiner

*Primary Examiner* — Nguyen Tran
(74) *Attorney, Agent, or Firm* — McDermott Will & Emery LLP

(57) ABSTRACT

There are provided an apparatus for and a method of controlling a power supply system. The apparatus for controlling a power supply system includes an offset correction circuit equally dividing an input voltage into n (n is a natural number larger than 2) and outputting n divided voltages, and a control unit using an analog-to-digital converter (ADC) to detect the n divided voltages output from the offset correction circuit, and determining a difference in levels between a value of the detected n divided voltages and a value calculated by dividing the input voltage by n, as an offset correction value.

14 Claims, 5 Drawing Sheets

APPARATUS FOR AND METHOD OF CONTROLLING POWER SUPPLY SYSTEM

CROSS-REFERENCE TO RELATED APPLICATIONS

This application claims the priority of Korean Patent Application No. 10-2012-0155301 filed on Dec. 27, 2012, in the Korean Intellectual Property Office, the disclosure of which is incorporated herein by reference.

BACKGROUND OF THE INVENTION

1. Field of the Invention

The present invention relates to an apparatus for and a method of controlling a power supply system capable of correcting an offset therein.

2. Description of the Related Art

A power supply system is an essential element in various electronic devices. Such a power supply system is provided for the stable supply of power to electronic devices. For this purpose, precision control is required therein.

Controlling of the power supply system is performed by a control apparatus. For example, power supply system operations are controlled by using a micro control unit (MCU) as the control apparatus.

The control apparatus may monitor the voltage level of currents input to or output from the power supply system, the current voltage level of the power supply system, and the like, to improve a degree of freedom of control.

However, the control apparatus receives predetermined voltages (for example, analog voltage, or the like) to perform the control. To this end, the control apparatus uses a predetermined analog-to-digital converter (ADC) to detect an analog voltage value.

However, the analog-to-digital converter itself has an input offset, such that errors between actually detected values and real values occur.

Further, an error may occur, even when detecting input voltage as a reference voltage for the control apparatus.

Therefore, an error may occur in the control apparatus at the time of the detection of an external voltage signal, leading to difficulties in performing precision control.

The following Related Art Document relates to the related art and does not disclose solutions of the above-mentioned problems.

RELATED ART DOCUMENT

Japanese Patent Laid-Open Publication No. 2007-086525

SUMMARY OF THE INVENTION

An aspect of the present invention provides an apparatus for and method of controlling a power supply system capable of correcting an offset occurring at the time of analog-to-digital conversion or in an externally input voltage to more accurately perform driving control.

According to an aspect of the present invention, there is provided an apparatus for controlling a power supply system, including: an offset correction circuit equally dividing an input voltage into n (n is a natural number larger than 2) and outputting n divided voltages; and a control unit using an analog-to-digital converter (ADC) to detect the n divided voltages output from the offset correction circuit, and determining a difference in levels between a value of the detected n divided voltages and a value calculated by dividing the input voltage by n, as an offset correction value.

The offset correction circuit may include: an input terminal receiving the input voltage; and n resistors connected to the input terminal in series and having an equivalent resistance value, and the control unit may detect the n divided voltages from any one of a plurality of contacts between the n resistors.

The control unit may include: an ADC module using an ADC terminal to detect the n divided voltages; and an offset correction unit setting a difference in voltage levels between the n divided voltages detected by the ADC module and a value calculated by dividing the input voltage by n as the offset correction value.

The offset correction unit may reflect the offset correction value in a predetermined voltage provided by the ADC module to perform the correction and the control unit may further include a control unit using the voltage corrected by the offset correction unit to control the power supply system.

According to an aspect of the present invention, there is provided an apparatus for controlling a power supply system, including: a voltage correction circuit outputting a first voltage obtained by reflecting a specific ratio in a reference voltage; and a control unit detecting the first voltage output from the voltage correction circuit, and setting a ratio of levels between a first value calculated by reflecting the specific ratio in the reference voltage and the detected first voltage, as a voltage correction value.

The reference voltage may be generated from a source independent of input voltage provided by the control apparatus.

The voltage correction circuit may include an input terminal receiving the reference voltage; a first resistor having one terminal connected to the input terminal and having a first resistance value; and a second resistor connected to the first resistor in series and having a second resistance value.

The control unit may include an input terminal connected to a contact between the first and second resistors to receive the first voltage; and a voltage correction unit calculating a difference in levels between a first value obtained by reflecting the specific ratio in the reference voltage and the first voltage to determine the voltage correction value and reflecting the determined voltage correction value in the input voltage provided by the control apparatus to perform the correction.

The voltage correction unit may multiply a ratio of a second resistance value, with a summed value of the first resistance value and the second resistance value, by the reference voltage, to calculate the first value.

The apparatus for controlling a power supply system may further include an offset correction circuit equally dividing an input voltage into n (n is a natural number larger than 2) and outputting n divided voltages; and the control unit may use an analog-to-digital converter (ADC) to detect the n divided voltages output from the offset correction circuit and may determine a difference in levels between a value of the detected n divided voltages and a value calculated by dividing the input voltage by n, as an offset correction value.

The offset correction circuit may include: an input terminal receiving the input voltage; and n resistors connected to the input terminal in series and having an equivalent resistance value, and the control unit may detect the n divided voltages from any one of a plurality of contacts between the n resistors and may set a difference in levels between the detected n divided voltages and a value calculated by dividing the input voltage by n, as the offset correction value.

According to an aspect of the present invention, there is provided a method of controlling a power supply system, for use in an apparatus for controlling a power supply system, the method including: comparing an actually detected value and a calculated value of input voltage to calculate an offset correction value of analog-to-digital conversion of the control apparatus; and reflecting the calculated offset correction value in voltage input through an analog-to-digital converter (ADC) of the control apparatus to perform correction.

The calculating of the offset correction value may include: equally dividing the input voltage into n (n is a natural number larger than 2) to generate n divided voltages; detecting the generated n divided voltages by using the ADC and comparing the detected n divided voltages with voltage calculated by dividing the input voltage by n to calculate the offset correction value.

The method for controlling a power supply system may further include: comparing an actually detected value and a calculated value of first voltage obtained by reflecting a specific ratio in a reference voltage to calculate a voltage correction value of the control apparatus; and reflecting the calculated voltage correction value to correct input voltage provided by the control apparatus.

The calculating of the voltage correction value may include detecting first voltage obtained by reflecting a specific ratio in a reference voltage; reflecting the specific ratio in the reference voltage to calculate the first value; and setting a ratio of levels between the calculated first value and the detected first voltage as the voltage correction value.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Hereinafter, embodiments of the present invention will be described in detail with reference to the accompanying drawings. The invention may, however, be embodied in many different forms and should not be construed as being limited to the embodiments set forth herein.

Rather, these embodiments are provided so that this disclosure will be thorough and complete, and will fully convey the scope of the invention to those skilled in the art.

Figure 1:
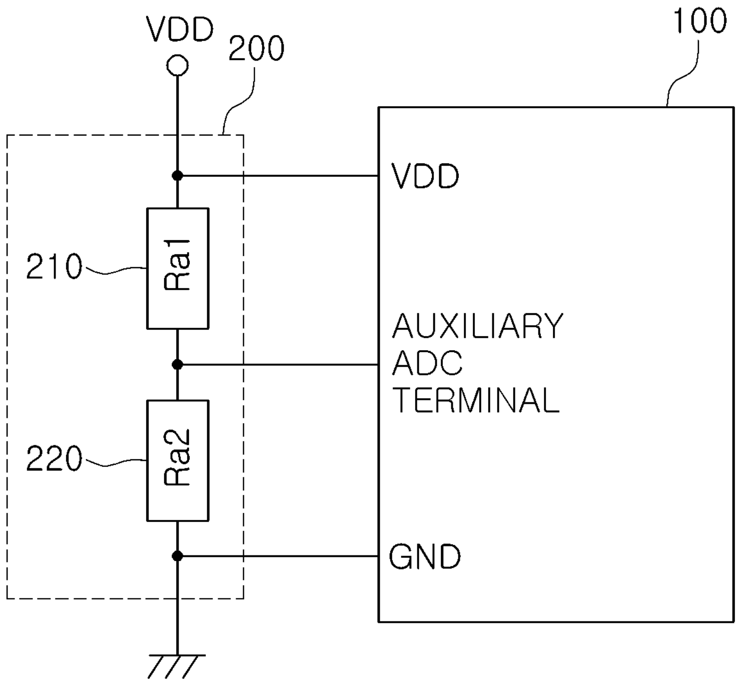
FIG. 1 is a schematic configuration diagram of a control apparatus according to an embodiment of the present invention.
Figure 4:
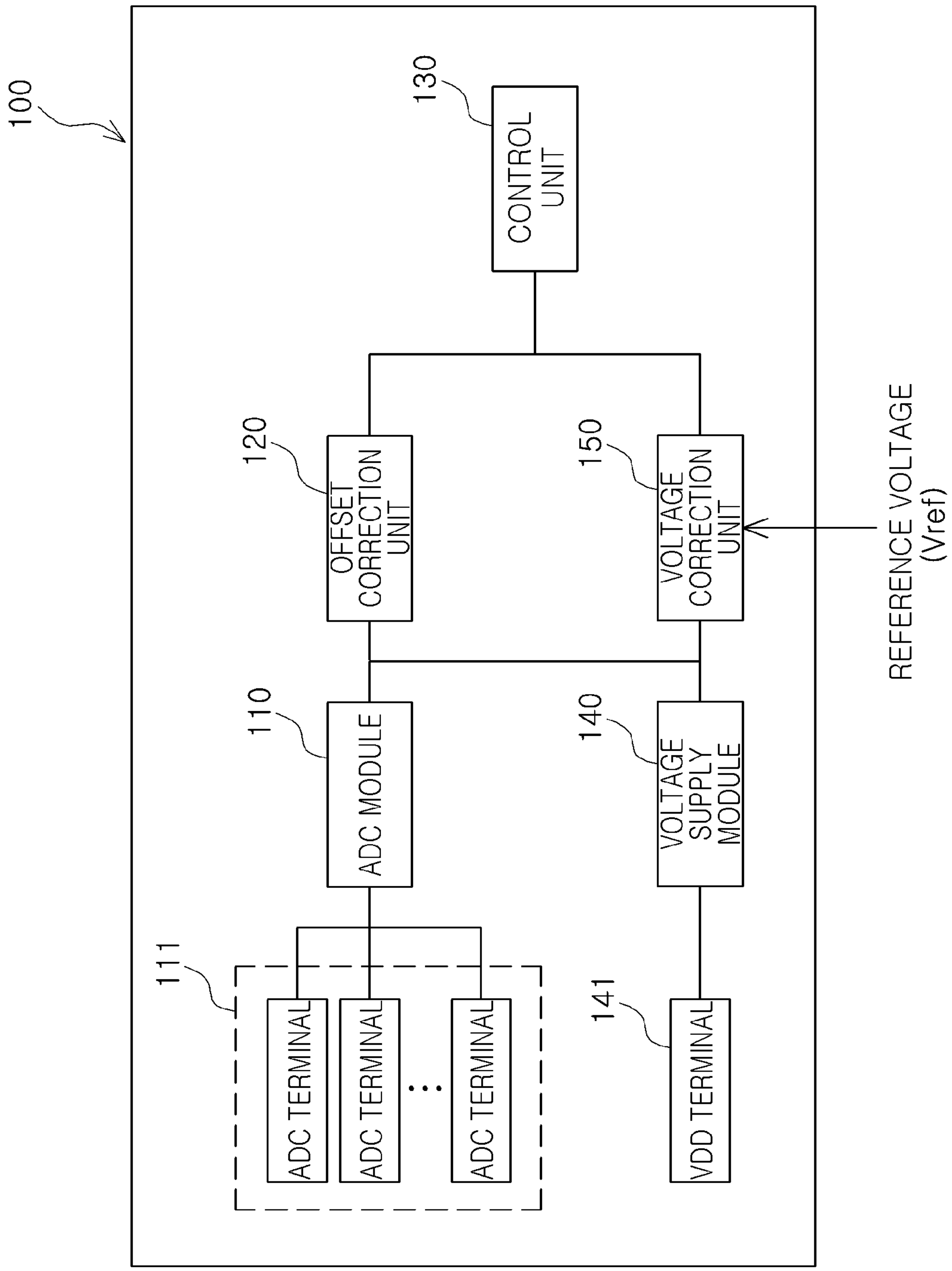
FIG. 4 is a schematic configuration diagram of a control unit according to an embodiment of the present invention.

FIG. 1 is a schematic configuration diagram of a control apparatus according to an embodiment of the present invention and FIG. 4 is a schematic configuration diagram of a control unit according to an embodiment of the present invention.

Hereinafter, an embodiment of the control apparatus according to the embodiment of the present invention, that is, an embodiment of the present invention capable of correcting an offset in an analog-to-digital converter (ADC) will be described with reference to FIGS. 1 and 4.

Referring to FIG. 1, the control apparatus includes an offset correction circuit 200 and a control unit 100.

The offset correction circuit 200 may equally divide the input voltage into n (n is a natural number larger than 2) to output n divided voltages. Here, the input voltage may be voltage VDD, provided by the control unit 100.

In the embodiment, the offset correction circuit 200 may be configured of a resistor serially connected to an input terminal. In detail, the input terminal is a terminal receiving the input voltage and may be serially connected to n resistors having an equivalent resistance value.

The illustrated embodiment describes an example in which the offset correction circuit 200 is configured of two resistors Ra1 and Ra2 which have an equivalent resistance value. Therefore, voltage acquired at a connection between the two resistors Ra1 and Ra2 corresponds to a voltage value of VDD/2.

The control unit 100 controls an operation of a power supply system. For example, likewise a micro control unit (MCU), and the like, the control unit 100 may include a control module which performs predetermined operation processing, a storage module, and an external input terminal.

The control unit 100 includes an analog-to-digital converter (hereinafter, ADC) and may correct the offset in the ADC. Further, the control unit 100 may detect n divided voltages from any one of a plurality of contacts between n resistors of the offset correction circuit 200 to correct the offset in the ADC.

In detail, the control unit 100 uses the ADC to detect the n divided voltages output from the offset correction circuit 200. The control unit 100 may determine, as an offset correction value, a difference in levels between a value of the detected n divided voltages and a value calculated by dividing the input voltage by n. For example, in the case that the each of two resistors Ra1 and Ra2 is 3.3Ω and the number of allocated bits of the ADC is 10, the level of the ADC input through an auxiliary ADC terminal is a half of the input voltage VDD. Therefore, since the number of allocated bits of the ADC is 10, the value calculated by dividing the input voltage by 2 becomes a value of 1024/2=512. For example, when the voltage level detected by the ADC is 516, it has 4 levels of difference from 512, as determined by calculation. Therefore, the control unit 100 may determine a result obtained by subtracting the actually detected n division value 516 from the value 512 calculated by calculation, that is, −4 as the offset correction value.

Describing the control unit 100 with reference to FIG. 4 in more detail, the control unit 100 may include an ADC terminal 111, an ADC module 110, an offset correction unit 120, and a control unit 130.

The ADC terminal 111 is at least one terminal that may be connected externally.

The ADC module 110 may analog-to-digital convert the signal input from the ADC terminal 111. Therefore, the ADC module 110 may use the ADC terminal to detect the n divided voltages from the offset correction circuit 200.

As described above, the offset correction unit 120 may set the difference in voltage levels between the n division value detected by the ADC module 110 and the value calculated by dividing the input voltage by n, as the offset correction value.

In one embodiment, when the offset correction value is set, the offset correction unit 120 may reflect the offset correction value in the predetermined value provided by the ADC module 110 to perform the correction. The control unit 130 may use the voltage corrected by the offset correction unit 120 to control the power supply system.

Figure 2:
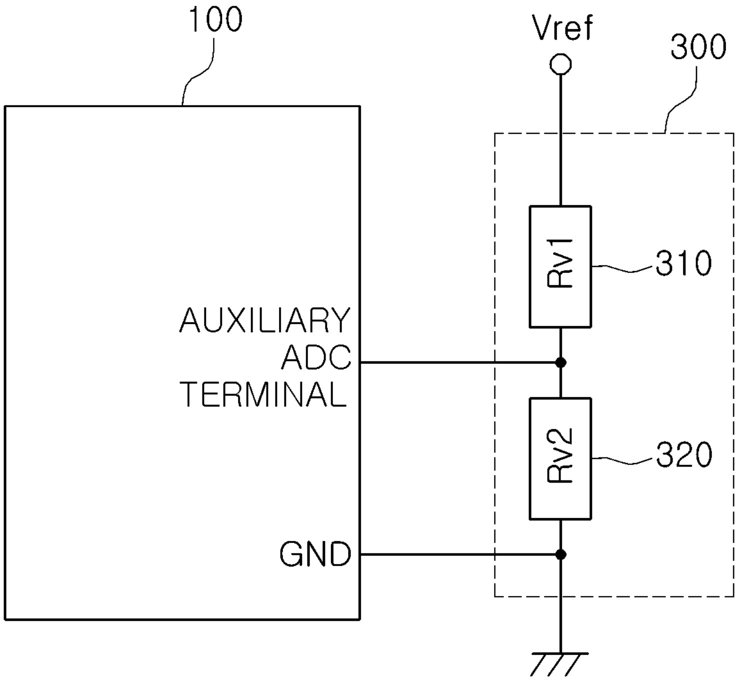
FIG. 2 is a schematic configuration diagram of a control apparatus according to another embodiment of the present invention.

FIG. 2 is a schematic configuration diagram of a control apparatus according to another embodiment of the present invention. Hereinafter, another embodiment of the control apparatus according to the present invention, that is, one embodiment of correcting the error of the input voltage provided by the control module 200 will be described with reference to FIGS. 2 and 4.

Referring to FIG. 2, the control apparatus includes a voltage correction circuit 300 and the control unit 100.

The voltage correction circuit 300 may output first voltage obtained by reflecting a specific ratio in a reference voltage Vref.

In one embodiment, the voltage correction circuit 300 may include an input terminal receiving the reference voltage Vref and a plurality of resistors connected to the input terminal in series. Herein, the resistors may be the plurality of resistors, that is, a first resistor having one terminal connected to the input terminal and having a first resistance value and a second resistor connected to the first resistor in series and having a second resistance value. Herein, the first resistance value and the second resistance value become a resistance value for generating the above-mentioned specific ratio.

The control unit 100 detects the first voltage output from the voltage correction circuit 300. The control unit 100 may set a ratio of levels between a first value calculated by reflecting the specific ratio in the reference voltage Vref and the detected first voltage, as the voltage correction value.

In one embodiment, the control unit 100 may compare a first voltage level, a ratio of the input voltage to the first voltage detected by the voltage correction circuit 300, to a first calculation voltage level, a ratio of the input voltage to the first value calculated by reflecting the specific ratio in the reference voltage Vref, to thus set the compared value as the voltage correction value.

The input voltage VDD, the voltage VDD provided by the control apparatus, may be power generated from a source which is independent of the reference voltage Vref.

For example, in the case that the reference voltage Vref is 2.5V, the input voltage VDD is 3.3V, Rv1 is 1.7Ω, Rv2 is 3.3Ω, and the number of allocated bits of the ADC is 10, the voltage input through the auxiliary ADC terminal becomes 2.5*3.3/(3.3+1.7)=1.65V (first value), such that the first calculated voltage level may be 1.65V/3.3V*1024=512. Herein, when the ratio of the input voltage to the detected first voltage, that is, the first voltage level is detected as 523, the voltage correction value by the voltage input becomes 512/523. Therefore, the control unit 100 may multiply the voltage input through other ADC terminals with the voltage correction value 512/523 to perform the correction. Herein, when the above-mentioned offset correction value is also applied with reference to FIG. 1, the voltage correction value may be 512/(523−4).

Herein, the reference voltage or the voltage correction circuit 300 may also be connected to the control apparatus at all times or may be temporarily applied thereto for initial correction and then separated therefrom.

Describing the control unit 100 with reference to FIG. 4 in more detail, the control unit 100 may further include a VDD terminal 141, a voltage supply module 140, and a voltage correction unit 150.

The VDD terminal 141 is a terminal supplying the input voltage VDD to the outside and the voltage supply module 140 may provide the input voltage VDD through the VDD terminal 141.

The voltage correction unit 150 may calculate the above-mentioned voltage correction value and reflect the calculated voltage correction value in the input voltage provided by the control apparatus to be provided to the control unit 130. For example, the control unit 100 may use the ADC terminal 111 to detect the above-mentioned first voltage from the voltage correction circuit 300 and the voltage correction unit 150 may compare the first voltage level calculated by the ADC module 110 with the first calculation voltage level calculated as described above, to then calculate the voltage correction value as described above.

Therefore, herein, the ADC terminal 111 is connected to a contact between the first and second resistors of the voltage correction circuit 300 to serve as the input terminal receiving the first voltage.

In one embodiment, the voltage correction unit 150 may reflect the voltage correction value in the input voltage provided by the control apparatus to perform the correction. In detail, the voltage correction unit 150 may control the voltage supply module 140 by reflecting the voltage correction value to generate the corrected input voltage VDD.

Figure 3:
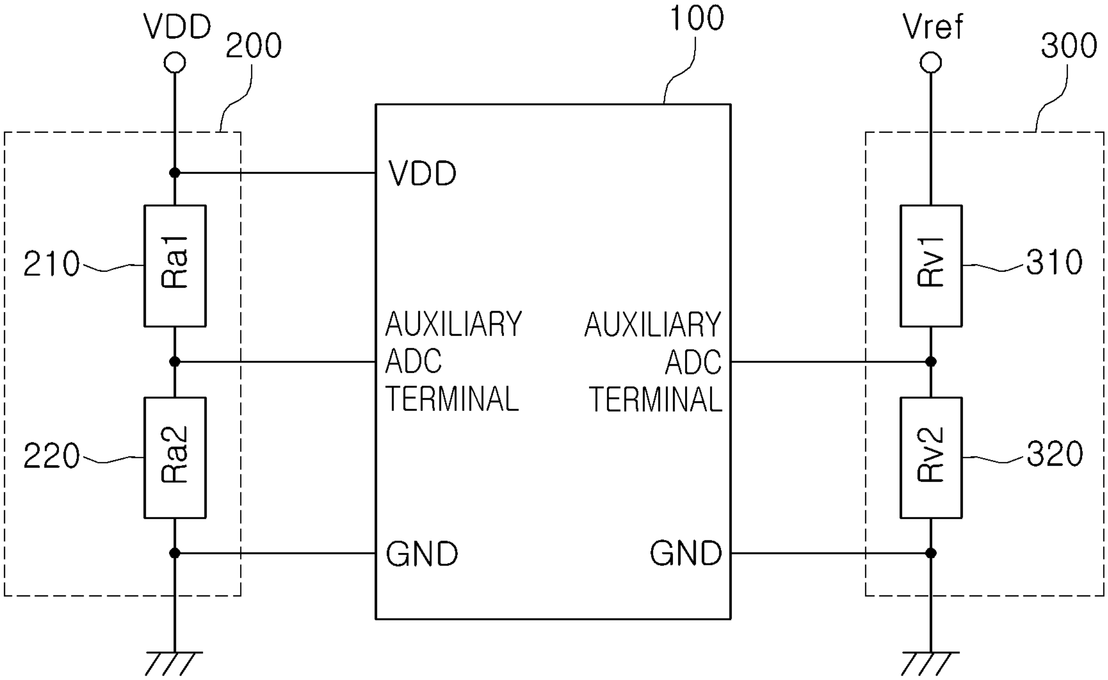
FIG. 3 is a schematic configuration diagram of a control apparatus according to another embodiment of the present invention.

FIG. 3 is a schematic configuration diagram of a control apparatus according to another embodiment of the present invention.

Another embodiment illustrated in FIG. 3 illustrates the embodiment including both of the offset correction circuit 200 and the voltage correction circuit 300.

Herein, the detailed operation of the offset correction circuit 200, the voltage correction circuit 300, and the control module 100 are described above, and therefore the description thereof will be omitted.

However, when both of the offset correction and the voltage correction are performed, the offset in the ADC may first be corrected using the offset correction circuit 200. The reason for this is that even when the voltage is corrected by the voltage correction circuit 300, the analog-to-digital conversion using the ADC module is used, and therefore an error (an offset error), occurring at the time of the conversion, first needs to be corrected.

Figure 5:
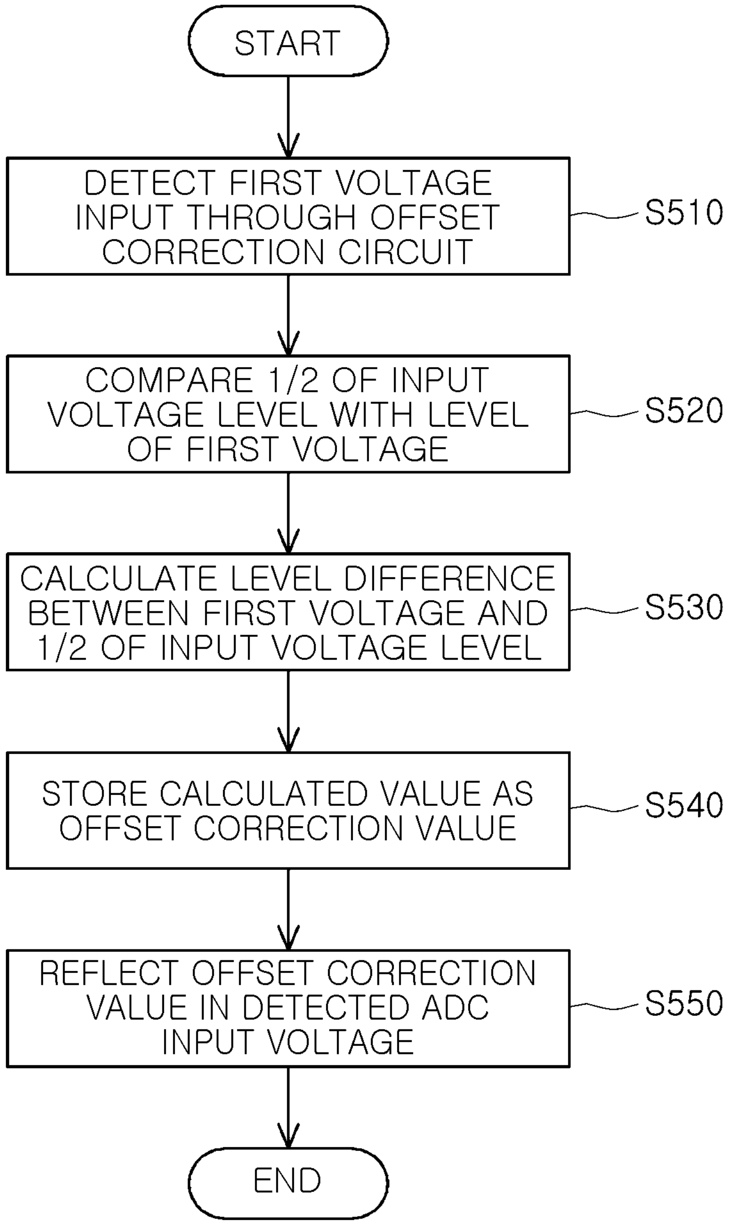
FIG. 5 is a flow chart illustrating a method of controlling a power supply system according to an embodiment of the present invention.
Figure 6:
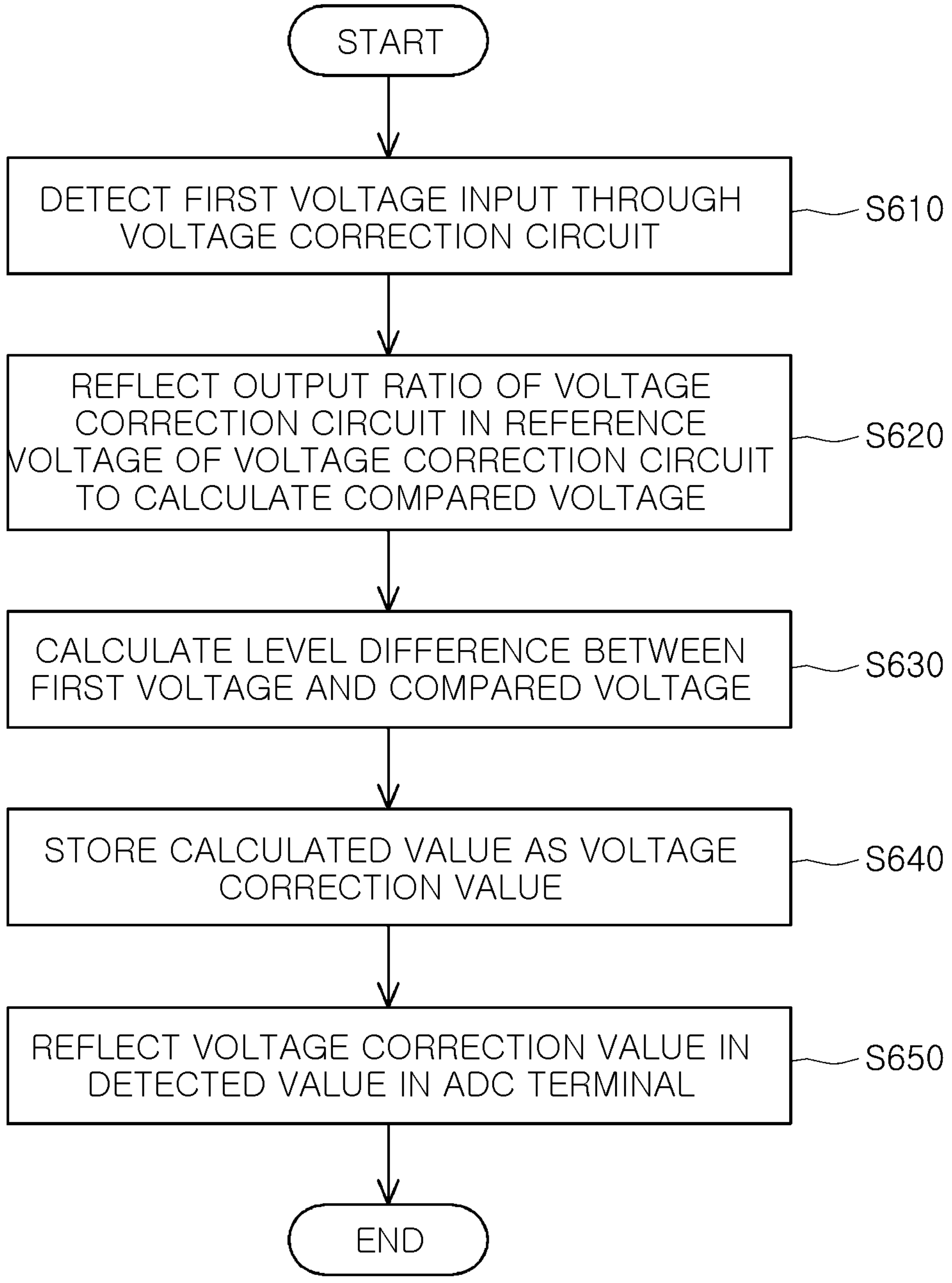
FIG. 6 is a flow chart illustrating a method of controlling a power supply system according to another embodiment of the present invention.

FIG. 5 is a flow chart illustrating a method of controlling a power supply system according to an embodiment of the present invention, that is, the offset correction, and FIG. 6 is a flow chart illustrating a method of controlling a power supply system according to another embodiment of the present invention, that is, the voltage correction.

Various embodiments of a method of controlling a power supply system to be described below with reference to FIGS. 5 and 6 are performed in the apparatus for controlling a power supply system described above with reference to FIGS. 1 to 4, and the contents overlapped with the foregoing description are not repeatedly described below. However, the following description will be able to be understood with reference to the foregoing description.

In one embodiment of the method for controlling a power supply system, the control apparatus may compare the actually detected value and the calculated value of the input voltage to calculate the offset correction value of the analog-to-digital conversion of the control apparatus.

Next, the control apparatus may reflect the calculated offset correction value in the voltage input through the ADC to correct the offset in the ADC.

Hereinafter, one embodiment of the method for controlling a power supply system will be described in more detail with reference to FIG. 5. For convenience of explanation, the offset correction circuit 200, configured of two resistors having an equivalent resistance value as in an example illustrated in FIG. 1 is described herein as an example.

Referring to FIG. 5, in the control apparatus, the offset correction circuit may detect the first voltage (S510) and compare ½ of the input voltage VDD with the level of the first voltage (S520). The reason for this is that the offset correction circuit is configured of two resistors connected to each other in series and having the equivalent resistance value, and therefore the first voltage detected by the offset correction circuit corresponds to a half of the input voltage.

The control apparatus may calculate a difference in levels between the detected first voltage and a half value of the input voltage (S530) and store the calculated value as the offset correction value (S540).

Next, the offset correction may be performed by reflecting the offset correction value in the voltage detected by the ADC (S550).

In one embodiment, the control apparatus may equally divide the input voltage into n (n is a natural number larger than 2) to generate the n divided voltages, may use the ADC to detect the generated n divided voltages, and may compare the detected n divided voltages with the voltage calculated by dividing the input voltage by n to calculate the offset correction value.

FIG. 6 illustrates one embodiment of performing the voltage correction performed by the control apparatus.

The control apparatus may compare the actually detected value and the calculated value of the first voltage obtained by reflecting the specific ratio in the reference voltage to calculate the voltage correction value of the control apparatus (S610 to S640).

Next, the control apparatus may reflect the calculated voltage correction value to correct the input voltage provided by the control apparatus (S650).

Describing in more detail with reference to FIG. 6, the control apparatus may detect the first voltage input through the voltage correction circuit (S610) and may reflect an output ratio of the voltage correction circuit in the reference voltage input to the voltage correction circuit, to thus calculate the comparison voltage (S620).

Next, the control apparatus may calculate the level difference between the first voltage and the comparison voltage (S630) and may store the calculated value as the voltage correction value (S640).

In one embodiment of calculating the voltage correction value, the control apparatus may detect the first voltage obtained by reflecting the specific ratio in the reference voltage and may reflect the specific ratio in the reference voltage to calculate the first value. Next, the control apparatus may set the ratio of levels between the calculated first value and the detected first voltage, as the voltage correction value.

As set forth above, according to the embodiment of the present invention, the driving control may be more accurately performed by correcting the offset occurring at the analog-to-digital conversion or in the external input voltage.

While the present invention has been shown and described in connection with the embodiments, it will be apparent to those skilled in the art that modifications and variations can be made without departing from the spirit and scope of the invention as defined by the appended claims.

What is claimed is:

1. An apparatus for controlling a power supply system, comprising:

an offset correction circuit equally dividing an input voltage into n (n is a natural number larger than 2) and outputting n divided voltages; and a control unit using an analog-to-digital converter (ADC) to detect the n divided voltages output from the offset correction circuit, and determining a difference in levels between a value of the detected n divided voltages and a value calculated by dividing the input voltage by n, as an offset correction value.

2. The apparatus of claim 1, wherein the offset correction circuit includes:

an input terminal receiving the input voltage; and n resistors connected to the input terminal in series and having an equivalent resistance value, and the control unit detects the n divided voltages from any one of a plurality of contacts between the n resistors.

3. The apparatus of claim 1, wherein the control unit includes:

an ADC module using an ADC terminal to detect the n divided voltages; and an offset correction unit setting a difference in voltage levels between the n divided voltages detected by the ADC module and a value calculated by dividing the input voltage by n, as the offset correction value.

4. The apparatus of claim 3, wherein the offset correction unit reflects the offset correction value in a predetermined voltage provided by the ADC module to perform the correction and the control unit further includes a control unit using the voltage corrected by the offset correction unit to control the power supply system.

5. An apparatus for controlling a power supply system, comprising:

a voltage correction circuit outputting a first voltage obtained by reflecting a specific ratio in a reference voltage;

an offset correction circuit equally dividing an input voltage into n (n is a natural number larger than 2) and outputting n divided voltages; and a control unit detecting the first voltage output from the voltage correction circuit, and setting a ratio of levels between a first value calculated by reflecting the specific ratio in the reference voltage and the detected first voltage, as a voltage correction value, wherein the reference voltage is generated from a source independent of input voltage provided by the control unit, and wherein the control unit uses an analog-to-digital converter (ADC) to detect the n divided voltages output from the offset correction circuit, and determines a difference in levels between a value of the detected n divided voltages and a value calculated by dividing the input voltage by n, as an offset correction value.

6. The apparatus of claim 5, wherein the voltage correction circuit includes:

an input terminal receiving the reference voltage;

a first resistor having one terminal connected to the input terminal and having a first resistance value; and a second resistor connected to the first resistor in series and having a second resistance value.

7. The apparatus of claim 6, wherein the control unit includes:

an input terminal connected to a contact between the first and second resistors to receive the first voltage; and a voltage correction unit calculating a difference in levels between a first value obtained by reflecting the specific ratio in the reference voltage and the first voltage to determine the voltage correction value, and reflecting the determined voltage correction value in the input voltage provided by the control apparatus to perform the correction.

8. The apparatus of claim 7, wherein the voltage correction unit multiplies a ratio of a second resistance value with a summed value of the first resistance value and the second resistance value, by the reference voltage, to calculate the first value.

9. The apparatus of claim 5, wherein the offset correction circuit includes:

an input terminal receiving the input voltage; and n resistors connected to the input terminal in series and having an equivalent resistance value, and the control unit detects the n divided voltages from any one of a plurality of contacts between the n resistors, and sets a difference in levels between the detected n divided voltages and a value calculated by dividing the input voltage by n, as the offset correction value.

10. A method of controlling a power supply system, for use in an apparatus for controlling a power supply system, the method comprising:

comparing an actually detected value and a calculated value of input voltage to calculate an offset correction value of analog-to-digital conversion of the control apparatus; and reflecting the calculated offset correction value in voltage input through an analog-to-digital converter (ADC) of the control apparatus to perform correction, wherein the calculating of the offset correction value includes:

equally dividing the input voltage into n (n is a natural number larger than 2) to generate n divided voltages; and detecting the generated n divided voltages by using the ADC and comparing the detected n divided voltages with voltage calculated by dividing the input voltage by n to calculate the offset correction value.

11. The method of claim 10, further comprising:

comparing an actually detected value and a calculated value of first voltage obtained by reflecting a specific ratio in a reference voltage to calculate a voltage correction value of the control apparatus; and reflecting the calculated voltage correction value to correct input voltage provided by the control apparatus.

12. The method of claim 11, wherein the calculating of the voltage correction value includes:

detecting first voltage obtained by reflecting a specific ratio in a reference voltage;

reflecting the specific ratio in the reference voltage to calculate the first value; and setting a ratio of levels between the calculated first value and the detected first voltage as the voltage correction value.

13. The apparatus of claim 1, wherein the control unit uses the analog-to-digital converter (ADC) to detect the n equally divided voltages output from the offset correction circuit, and determines a difference in levels between a value of the detected n equally divided voltages and the value calculated by dividing the input voltage by n, as the offset correction value.

14. The apparatus of claim 1, wherein the control unit uses the analog-to-digital converter (ADC) to output at least one digital value corresponding to at least one of the n equally divided voltages output from the offset correction circuit, and determines the difference in levels between the at least one digital value output by the ADC and the value calculated by dividing the input voltage by n, as the offset correction value.

* * * * *